US011069513B2

(12) United States Patent
Koike et al.

(10) Patent No.: US 11,069,513 B2
(45) Date of Patent: Jul. 20, 2021

(54) CHARGED PARTICLE BEAM APPARATUS

(71) Applicant: KIOXIA CORPORATION, Tokyo (JP)

(72) Inventors: Mitsuo Koike, Yokohama Kanagawa (JP); See Kei Lee, Kawasaki Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/794,888

(22) Filed: Feb. 19, 2020

(65) Prior Publication Data

US 2021/0066045 A1    Mar. 4, 2021

(30) Foreign Application Priority Data

Sep. 3, 2019  (JP) .............................. JP2019-160515

(51) Int. Cl.
*H01L 37/00* (2006.01)
*H01J 37/32* (2006.01)
*H01J 37/147* (2006.01)
*H01J 37/30* (2006.01)

(52) U.S. Cl.
CPC .... *H01J 37/32449* (2013.01); *H01J 37/1478* (2013.01); *H01J 37/30* (2013.01); *H01J 2237/006* (2013.01)

(58) Field of Classification Search
CPC ............. H01J 37/32449; H01J 37/1478; H01J 2237/006; H01J 37/30
USPC ........................................... 250/492.1–492.3
See application file for complete search history.

(56) References Cited

U.S. PATENT DOCUMENTS

| 9,206,504 B2 * | 12/2015 | Mulders ................. G01N 1/286 |
| 2008/0067408 A1 * | 3/2008 | Winkler ................. H01J 37/08 |
| | | 250/423 F |
| 2015/0079796 A1 | 3/2015 | Chandler et al. |

FOREIGN PATENT DOCUMENTS

| JP | 2007-103107 A | 4/2007 |
| JP | 5498655 B2 | 5/2014 |

* cited by examiner

*Primary Examiner* — Michael Maskell
(74) *Attorney, Agent, or Firm* — Foley & Lardner LLP

(57) ABSTRACT

A charged particle beam apparatus has a chamber configured to accommodate a sample with. An inside of the chamber is decompressed. A tube having an opening is disposed in the chamber, and introduces a mixed gas having a plurality of types of gases, in a direction towards the sample. A first beam generator emits a charged particle beam toward at least one of a region between an opening of the tube and the sample, or a region of the sample against which the mixed gas collides. A mixed gas generator provides the mixed gas to the tube. The opening of the tube has an elongated shape in a cross section in a direction substantially perpendicular to a flow direction of the mixed gas.

20 Claims, 3 Drawing Sheets

CHARGED PARTICLE BEAM APPARATUS

CROSS-REFERENCE TO RELATED APPLICATION

This application claims the benefit of and priority to Japanese Patent Application No. 2019-160515, filed Sep. 3, 2019, the entire contents of which are incorporated herein by reference.

FIELD

Embodiments described herein relate generally to a charged particle beam apparatus.

BACKGROUND

In order to create a sample to be observed with an electron microscope or the like, the charged particle beam apparatus may finely process the sample. However, when the sample is deteriorated or uneven, a change is caused in an analysis evaluation result of the sample in the electron microscope or the like.

DETAILED DESCRIPTION

Figure 1:
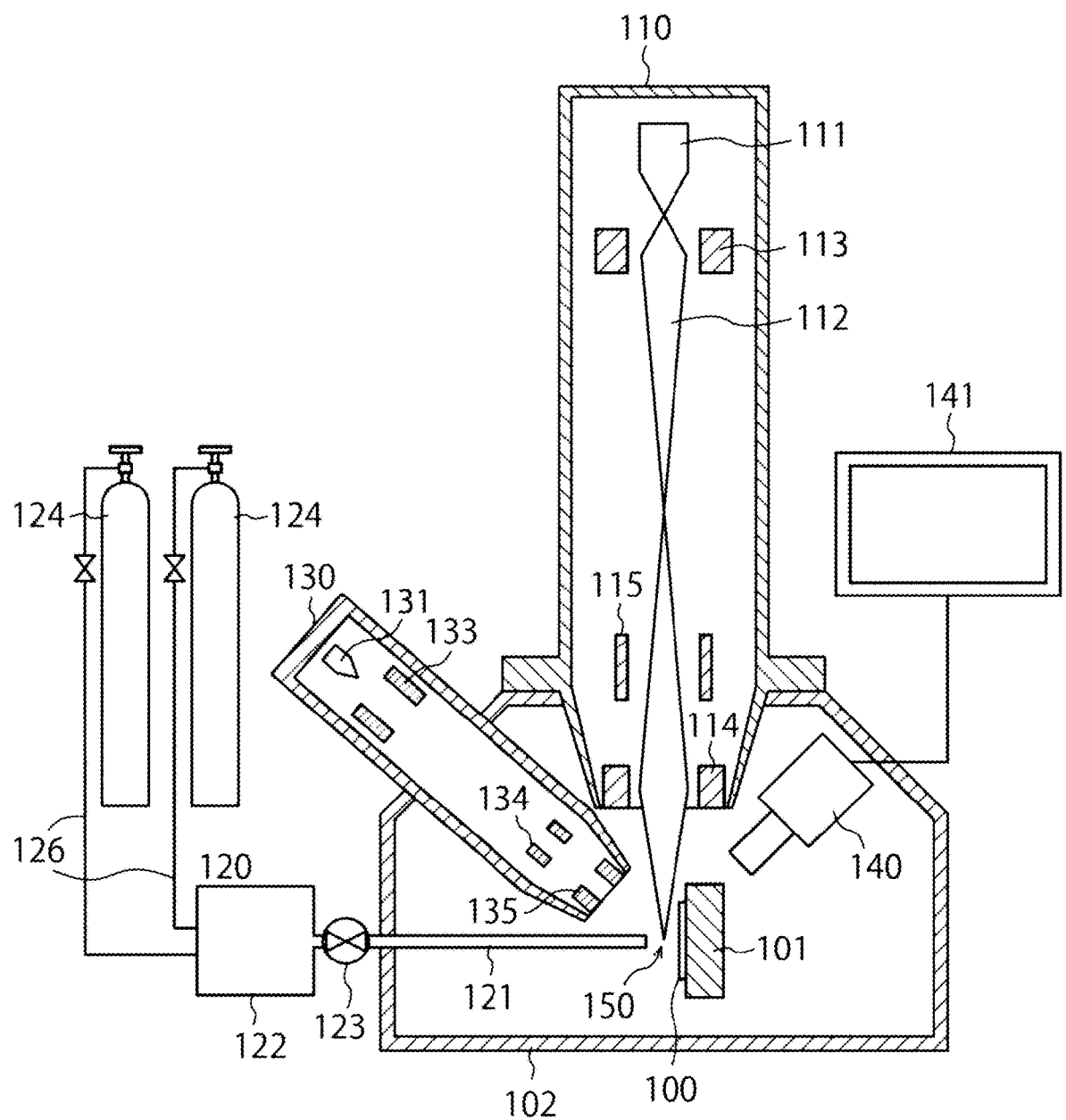
FIG. 1 is a cross-sectional view showing a configuration example of a charged particle beam apparatus according to a first embodiment.

Embodiments provide a charged particle beam apparatus capable of preventing deterioration and unevenness of an observation surface of a sample.

In general, according to one embodiment, the charged particle beam apparatus has a chamber which is configured to accommodate a sample and an inside of which is decompressed. A tube is inserted into (disposed or provided in) the chamber, and open toward the sample, and introduce mixed gas obtained by mixing a plurality of types of gases. A first beam generation unit (beam generator) emits a charged particle beam toward a region between an opening of the tube and the sample, or toward a region of the sample against which the mixed gas collides. A mixed gas generation unit (mixed gas generator) is connected to the tube and mixes a plurality of types of gases. The opening of the tube has an elongated shape in a cross section in a direction substantially perpendicular to a flow direction of the mixed gas.

Hereinafter, embodiments according to the present disclosure will be described with reference to drawings. The present embodiment does not limit the present disclosure. The drawings are schematic or conceptual, and a ratio of each part or the like is not necessarily the same as the actual one. In a specification and the drawings, the same reference numerals are given to the same elements as those which have been described with reference to the already-mentioned drawings, and the detailed description will be appropriately omitted.

First Embodiment

FIG. 1 is a cross-sectional view showing a configuration example of a charged particle beam apparatus according to a first embodiment. The charged particle beam apparatus (hereinafter also simply referred to as a beam apparatus) 1 is an apparatus which performs local reactive ion etching by emitting an ion beam to a sample 100 in a chamber 102. The beam apparatus 1 is not limited to this and may be applied to other ion beam apparatuses.

The beam apparatus 1 includes a stage 101, a chamber 102, a beam generation unit 110, a mixed gas generation unit 120, a beam generation unit 130, a secondary electron detector 140, and a monitor 141. The beam generation unit 130, the secondary electron detector 140, and the monitor 141 may be omitted.

The chamber 102 may accommodate the sample 100 and the stage 101, and an inside of the chamber 102 may be decompressed by a vacuum pump not shown. The stage 101 can mount the sample 100 and can adsorb the sample 100. The stage 101 may be movable in the chamber 102.

The beam generation unit 110 as a first beam generation unit includes an electron source 111, a condenser lens 113, an objective lens 114, and a deflection coil 115. The beam generation unit 110 may focus an electron beam 112 discharged from the electron source 111 and emit the electron beam 112 to the sample 100 or a gas path 150 located between a tube 121 and the sample 100. The electron source 111 may generate and discharge an electron beam 112 as a charged particle beam. The charged particle beam is not limited to the electron beam 112, and may be the ion beam or the like. The condenser lens 113 and the objective lens 114 may focus the electron beam 112. The deflection coil 115 may move a position of the electron beam 112 and emit the electron beam 112 to a freely-selected position.

The mixed gas generation unit 120 includes the tube 121, a buffer tank 122, and a pressure adjustment valve 123. The buffer tank 122 may receive a plurality of types of gases from a plurality of cylinders 124 detachably connected, and mix the plurality of types of gases to generate mixed gas 201. For example, a material having corrosion resistance and pressure resistance such as stainless steel is used for the buffer tank 122. The plurality of cylinders 124 and the buffer tank 122 may be respectively pipe-connected by a plurality of separate pipes 126. Similarly to the buffer tank 122, for example, a material having corrosion resistance and pressure resistance such as stainless steel may be used for the pipe 126. The pressure adjustment valve 123 may reduce pressure of the mixed gas 201 sent from the buffer tank 122 and send the mixed gas 201 to the tube 121 led to the chamber 102.

The mixed gas 201 may contain any of fluorocarbons (for example, $CF_4$, $C_2F_6$, $C_3F_8$, $C_4F_8$, $C_5F_{12}$, $C_2F_4$, $C_3F_6$, $C_5F_8$, $CHF_3$, $CH_2F_2$, $CH_3F$, $C_2H_2F_4$, $C_2H_4F_2$, $C_2HF_5$, $C_3H_3F_5$, $C_4H_3F$, $CCl_2F_2$, $CCl_3F$, $ClF_3$, $CHCl_2F$, $CHClF_2$, $C_2ClF_5$, $C_2Cl_4F_2$, $C_2Cl_3F_3$, $C_2Cl_2F_4$, $CHClFCF_3$, $(CF_3CO)_2$, $(CF_3)_2O$, $CBrF_3$, $(CBRF_2)_2$, $C_2F_5I$), organic halogen gases chlorine ($CCl_4$, $CHCl_3$, $C_2Br_2Cl_2$, $C_2Cl_4$, $C_2Cl_6$, $C_2HCl_3$, $CH_3Cl$, $CH_3I$, $C_2H_5I$, $C_3H_7I$, $COCl_2$), inorganic halogen gases ($SF_6$, $NF_3$, $SiF_4$, $HF$, $F_2$, $ClF_3$, $Cl_2$, $HCl$, $BCl_3$, $SiCl_4$, $Br_2$, $HBr$, $BBr_3$, $BrF_3$, $I_2$, $HI$, $IBr$, $ICl$, $IF_5$), and carbon-hydrogen gases ($CH_4$, $C_2H_6$, $C_2H_4$, $C_2H_2$, $CH_3OH$, $(CH_3)_2O$) as raw material gas. The mixed gas 201 contains any of rare gases (He, Ne, Ar, Kr, Xe) and the following gases ($O_2$, $H_2$, $N_2$, $CO$, $CO_2$, $NH_3$, $O_3$, $H_2O$, $N_2O$, $NO_2$, $SiH_4$, $B_2H_6$, $SO_2$) as the additive gas.

The tube 121 may be inserted into the chamber 102 from the buffer tank 122 through the pressure adjustment valve 123, and extend to the vicinity of the sample 100. The tube 121 may introduce the mixed gas 201 into the chamber 102 and jet the mixed gas 201 from an opening 125 of a tip end toward the sample 100. The tube 121 may be fixed in the chamber 102. The relative distance and relative position of the tube 121 and the sample 100 can be changed by an operation of the stage 101.

The beam generation unit 130 as a second beam generation unit (second beam generator) includes an ion beam source 131, a condenser lens 133, an objective lens 134, and a deflection coil 135. The beam generation unit 130 may emit an ion beam (hereinafter also referred to as a second ion beam) of an atom or a molecule having an atomic weight or a molecular weight larger than that of a component contained in the mixed gas 201 to the sample 100. The ion beam source 131 may generate and discharges the second ion beam. The condenser lens 133 and the objective lens 134 may focus the second ion beam. The deflection coil 135 may move the position of the second ion beam and emit the second ion beam to the freely-selected position. The second ion beam may be used for quickly cutting the sample 100 by physical etching.

The secondary electron detector 140 may detect secondary electrons obtained from the sample 100. The monitor 141 may receive an intensity of the secondary electrons from the secondary electron detector 140 and display the intensity distribution. For example, the secondary electron detector 140 may detect the secondary electrons from the sample 100 while the beam generation unit 110 scans a surface of the sample 100 and the tube 121 with the electron beam 112. Thereby, a user can check positions of the sample 100 and the tube 121 while referring to the monitor 141. Further, the beam generation unit 110 can reliably emit the electron beam 112 to the mixed gas 201 located between the tube 121 and the sample 100.

Figure 2:
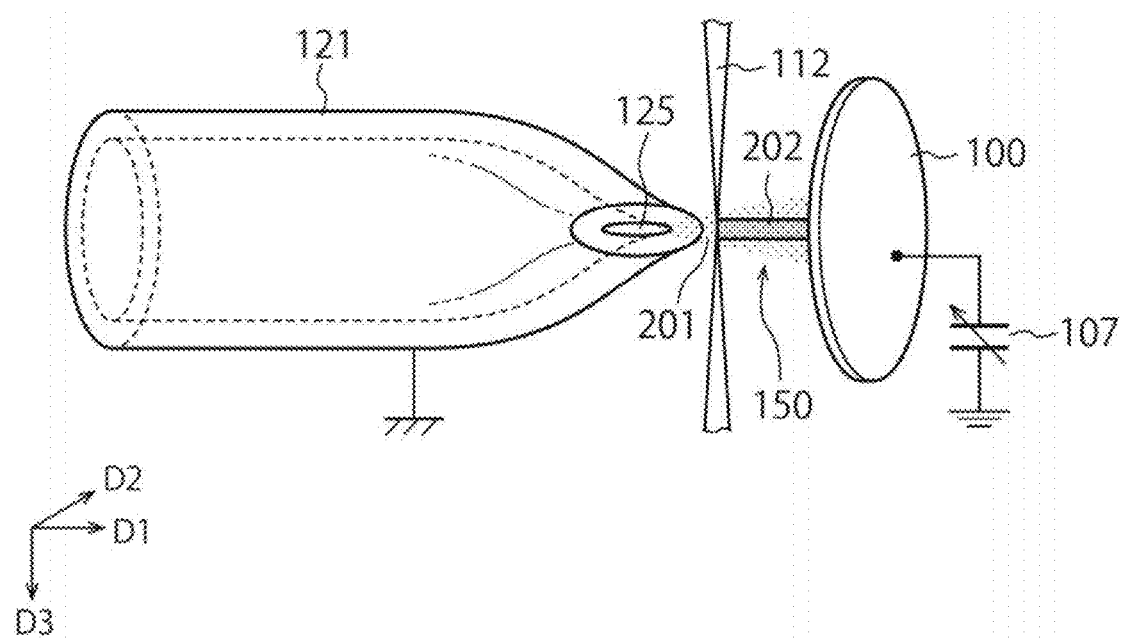
FIG. 2 is a diagram showing a state of generation of mixed ion gas in a gas path.

FIG. 2 is a diagram showing a state of generation of a mixed ion beam 202 in the gas path 150. The opening 125 may be provided at the tip end of the tube 121 as a slit, for example. The opening 125 has an elongated shape in a cross section in a direction substantially perpendicular to a flow direction D1 of the mixed gas 201. In the other words, the opening 125 has the elongated shape when viewed in the flow direction D1 of the mixed gas 201. The elongated shape of the opening 125 may be, for example, a rectangle or an ellipse. Further, a major axis direction (longer diameter direction) D2 of the elongated shape of the opening 125 intersects an emission direction D3 of the electron beam 112. For example, the major axis direction D2 of the elongated shape of the opening 125 is substantially perpendicular to the emission direction D3 of the electron beam 112. In this case, the minor axis direction (shorter diameter direction) D3 of the elongated shape of the opening 125 is substantially parallel to the emission direction D3 of the electron beam 112. A length of the opening 125 in the major axis direction D2 is, for example, about 10 μm, and a length of the opening 125 in the minor axis direction D3 is, for example, 1 μm or less.

The opening 125 of the tube 121 may jet the mixed gas 201 toward the sample 100. The mixed gas 201 jetted from the opening 125 may be jetted in an elongated shape having a major diameter of substantially the same length as the major axis direction D2 of the opening 125 and a minor diameter of substantially the same length as the minor axis direction D3 of the opening 125 in the cross section substantially perpendicular to the jet direction (direction of the gas path 150) D1 of the mixed gas 201. The mixed gas 201 may be emitted toward the sample 100 while diffusing in a reduced-pressure atmosphere. Therefore, the mixed gas 201 immediately after being jetted from the opening 125 may have substantially the same size and substantially the same shape as the opening 125 in the cross section substantially perpendicular to the jet direction (direction of the gas path 150) D1 of the mixed gas 201. Thereafter, the mixed gas 201 may be emitted to the sample 100 while gradually diffusing.

The electron beam 112 may be emitted in the gas path 150 through which the mixed gas 201 passes. The beam generation unit 110 may emit the electron beam 112 from the direction D3 which intersects both the major axis direction D2 of the opening 125 and the flow direction D1 of the mixed gas 201. For example, the emission direction D3 of the electron beam 112 is substantially perpendicular to both the major axis direction D2 of the opening 125 and the flow direction D1 of the mixed gas 201. In the other words, the emission direction D3 of the electron beam 112 is substantially perpendicular to the major axis direction D2 of the opening 125 when viewed in the flow direction D1 of the mixed gas 201.

In a region in which the electron beam 112 is emitted in the mixed gas 201, a plurality of types of gases constituting the mixed gas 201 may be ionized or radicalized. Thereby, the mixed gas 201 may become the mixed ion beam (multi-gas ion beam) 202 and may be emitted to the sample 100. For example, when the sample 100 is a silicon oxide film, the mixed gas 201 may be mixed gas of $CF_4$ gas and $H_2$ gas, and the mixed ion beam 202 may be an ion beam obtained by mixing $CF_2$ gas, $F_2$ gas, and $H_2$ gas. Thereby, an etching rate of the silicon oxide film can be increased. For example, when the sample 100 is silicon, the mixed gas 201 may be mixed gas of XeF gas and Ar gas, and the mixed ion beam 202 may be an ion beam obtained by mixing Xe gas, $F_2$ gas, and Ar gas. Thereby, an etching rate of silicon can be increased. For example, when the sample 100 is tungsten, the mixed gas may be mixed gas of CF-based gas and $O_2$ gas, and the mixed ion beam 202 may be an ion beam obtained by mixing $CF_2$ gas and $O_2$ gas. Thereby, an etching rate of tungsten to silicon can be increased.

The stage 101 on which the sample 100 is mounted is, for example, applied with a positive voltage. The tube 121 is, for example, applied with a ground voltage. Thereby, the mixed ion beam 202 can be accelerated and emitted to the sample 100.

Figure 3:
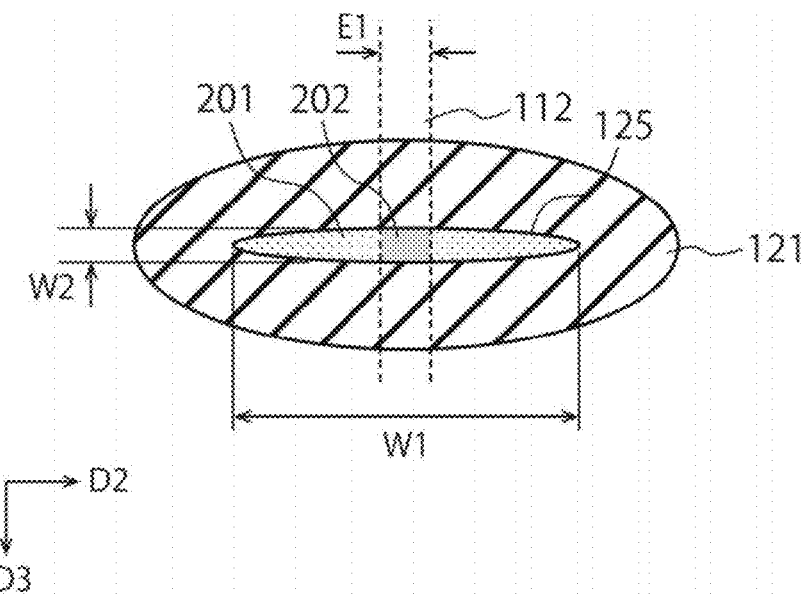
FIG. 3 is a front view of a tip end of a tube viewed from a flow direction of mixed gas.

FIG. 3 is a front view of the tip end of the tube 121 viewed from the flow direction D1 of the mixed gas 201. The opening 125 of the tube 121 has an elongated shape which has a major diameter W1 in the direction D2 and a minor diameter W2 in the direction D3. The major diameter of the mixed gas 201 immediately after being jetted from the opening 125 may be substantially equal to the major diameter W1 of the opening 125. The minor diameter of the mixed gas 201 immediately after being jetted from the opening 125 may be substantially equal to the minor diameter W2 of the opening 125.

Further, when the electron beam 112 is emitted to the mixed gas 201, the mixed gas 201 may be ionized or radicalized to form the mixed ion beam 202 in an emission region of the electron beam 112. Assuming that a width of the electron beam 112 in the direction D2 is E1, in the cross section (D2-D3 plane) in the direction substantially perpendicular to the flow direction D1 of the mixed gas 201 and the mixed ion beam 202, a width of the mixed ion beam 202 in the direction D2 may correspond to (or be equal to) the width E1 of the electron beam 112 and become substantially equal. In the same cross section, a width (thickness) of the mixed ion beam 202 in the direction D3 may correspond to (or be equal to) the minor diameter W2 of the opening 125 and become substantially equal. That is, the mixed ion beam 202 may be a beam having an area of E1×W2 in a cross section (D2-D3 plane) substantially perpendicular to the flow direction D1 of the mixed gas 201 and the mixed ion beam 202. The width E1 of the electron beam 112 can be reduced to about 10 nm or less by being focused in the beam generation unit 110. Further, the minor diameter of the opening 125 can be reduced to about 1 µm or less as described above. Thereby, the beam apparatus 1 according to the present embodiment can generate the mixed ion beam 202 having a very small cross-sectional area of 10 nm×1 µm or less.

Thus, a shape of the cross section (D2-D3 plane) substantially perpendicular to the direction D1 of the mixed ion beam 202 can be controlled by the minor diameter W2 of the opening 125 and the width E1 of the electron beam 112. The opening 125 may have a substantially elliptical diameter by crushing the tip end of the tube 121. Alternatively, a nozzle having an elongated opening 125 may be attached to the tip end of the tube 121. The minor diameter W2 may vary depending on the method of crushing the tip end of the tube 121 and the method of forming the nozzle, and can be reduced to about 1 µm or less. Further, the width E1 of the electron beam 112 can be reduced to about 10 nm or less by being focused in the beam generation unit 110. Therefore, the beam apparatus 1 according to the present embodiment can generate the mixed ion beam 202 having a very small cross-sectional area of 10 nm×1 µm or less. Thereby, the beam apparatus 1 can etch a narrow region of the sample 100, and can easily perform fine processing on the sample 100.

The mixed ion beam 202 may be accelerated toward, for example, the stage 101 to which voltage is applied by variable voltage 107 shown in FIG. 2, and may be emitted to the sample 100 on the stage 101. The surface of the sample 100 may be etched by chemically reacting with the mixed ion beam 202. That is, the sample 100 may be chemically etched by a reactive ion etching (RIE) using the mixed ion beam 202.

By the way, when the sample 100 is physically etched by a collision of the second ion beam, the etching rate can be increased, but the etched surface of the sample 100 may become rough, and the etching gas may enter and remain inside the sample 100. On the other hand, when the chemical etching is performed as in the RIE method, the etched surface of the sample 100 may become smooth, and it is possible to prevent the etching gas from entering inside the sample 100.

On the other hand, when the sample 100 is etched by the RIE method, the etching gas may diffuse in a reduced pressure atmosphere of the chamber, and an inner wall of the chamber may be corroded at the same time. In order to prevent the diffusion of the etching gas, a method of emitting reactive ions to a narrow region of the sample 100 in a limited manner can be considered.

However, it was difficult to finely form a multi-ion beam in which a plurality of reactive ion gases are mixed. For example, in selective etching of silicon or a silicon oxide film, a multi-ion beam obtained by mixing radicals $CF_\chi$, $F^+$, and ion $CF_3^+$ which are generated by ionization of fluorocarbon $CF_4$ is required. However, it was difficult to emit such a multi-ion beam to a narrow region.

On the other hand, the beam apparatus 1 according to the present embodiment may jet the mixed gas 201 obtained by mixing a plurality of types of gases from the elongated opening 125 of the tube 121, and emit the electron beam 112 from the direction D3 which intersects both the major diameter of the opening 125 and the flow direction D1 of the mixed gas 201. Thereby, the part which received the electron beam 112 among the jetted mixed gas 201 may be ionized. That is, the intersection region between the jetted mixed gas 201 and the electron beam 112 may be locally ionized to become a mixed ion beam 202. Thereby, a cross-sectional area of the mixed ion beam 202 on a surface of the sample 100 can be made very small, and the mixed ion beam 202 can be emitted to the narrow region of the sample 100.

Further, a generation position of the mixed ion beam 202 may be changed by changing an emission position (intersection position) of the electron beam 112 to the mixed gas 201. That is, the beam generation unit 110 can move the mixed ion beam 202 within a range of the mixed gas 201 by changing the emission position of the electron beam 112. At this time, the mixed gas 201 may be fixed relative to the sample 100 or may be moved.

The mixed ion beam 202 may diffuse in a reduced pressure atmosphere, similarly to the mixed gas 201. Therefore, the emission position of the electron beam 112 to the mixed gas 201 may be at least any position in the gas path 150 from the opening 125 of the tube 121 to the sample 100, and may be preferably closer to the sample 100. By bringing the emission position of the electron beam 112 closer to the sample 100, diffusion of the mixed ion beam 202 can be prevented, and the mixed ion beam 202 can be emitted to a narrower region of the sample 100.

The mixed ion beam 202 may be locally generated in the emission region of the electron beam 112 among the mixed gas 201. Therefore, the diffusion of the mixed ion beam 202 can be limited, and the mixed ion beam 202 which does not contribute to the etching can be greatly reduced. Further, it is possible that the mixed gas 201 which diffuses without being ionized does not corrode the chamber 102. Therefore, corrosion of the chamber 102 can be prevented.

Further, the emission position of the electron beam 112 may be a surface region of the sample 100 against which the mixed gas 201 collides. Thereby, the mixed gas 201 may be ionized immediately before or after colliding at the sample 100 to etch the sample 100. Thereby, it becomes possible to etch only the emission region of the electron beam 112 in the surface region of the sample 100. In this case, the area and position of the etching region are substantially equal to the emission area and emission position of the electron beam 112, and can be controlled by the emission area and emission position of the electron beam 112.

Modification Example

Figure 4:
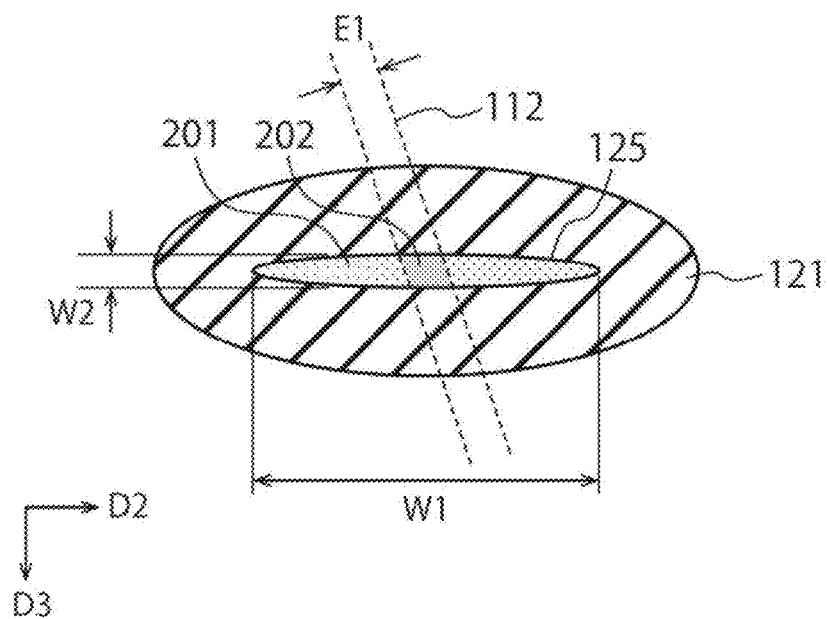
FIG. 4 is a front view of a tube according to a modification example of the first embodiment.

FIG. 4 is a front view of the tube 121 according to a modification example of the first embodiment. In this modification example, an emission direction of the electron beam 112 may be inclined in the cross section (D2-D3 plane) substantially perpendicular to the flow direction D1 of the mixed gas 201. That is, the electron beam 112 in this modification example may be inclined with respect to the major axis direction D2 and the minor axis direction D3 of the opening 125 of the tube 121. In the other words, the emission direction of the electron beam 112 according to the modification example of the first embodiment is inclined with respect not only to the major axis direction (longer diameter direction) D2 and but also to the minor axis direction (shorter diameter direction) D3 of the opening 125 of the tube 121, when viewed in the flow direction D1 of the mixed gas 201. In this case, the width of the mixed ion beam 202 in the direction D2 can be made slightly larger than the width E1 of the electron beam 112 while keeping the cross-sectional area of the mixed ion beam 202 sufficiently small. Even in this modification example, an effect of the first embodiment can be obtained. Further, a shape of the cross-sectional area of the mixed ion beam 202 on the surface of the sample 100 can be adjusted.

Second Embodiment

Figure 5:
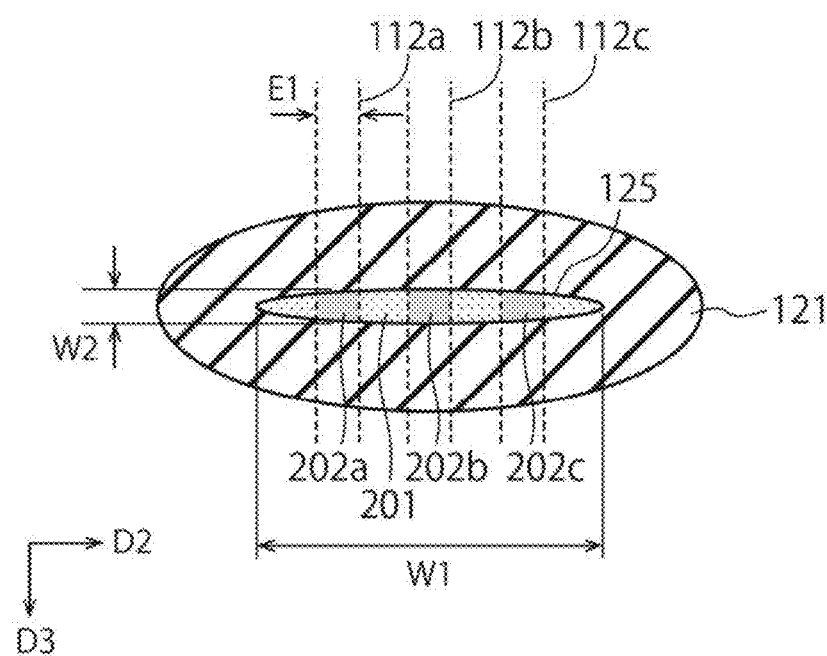
FIG. 5 is a front view of a tube according to a modification example of a second embodiment.

FIG. 5 is a front view of the tube 121 according to a modification example of a second embodiment. In the second embodiment, the beam generation unit 110 may emit a plurality of electron beams 112a to 112c to the mixed gas 201. Thereby, a plurality of mixed ion beams 202a to 202c may be simultaneously emitted to the sample 100. By emitting the plurality of mixed ion beams 202a to 202c to the sample 100, a plurality of etching regions can be etched simultaneously. This can lead to shortening of etching time.

The mixed ion beams 202a to 202c may have the same configuration as the mixed ion beam 202 of the first embodiment respectively. Therefore, the second embodiment can also obtain the effect of the first embodiment.

The second embodiment may be combined with the above modification example. That is, the electron beam 112 may be emitted in an inclined state with respect to the mixed gas 201.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A charged particle beam apparatus comprising:
   a chamber configured to accommodate a sample with an inside of the chamber being decompressed;
   a tube having an opening disposed in the chamber and configured to introduce a mixed gas, having a plurality of types of gases, in a direction towards the sample;
   a first beam generator configured to emit a charged particle beam toward at least one of a region between an opening of the tube and the sample or a region of the sample against which the mixed gas collides; and
   a mixed gas generator configured to provide the mixed gas to the tube,
   wherein the opening of the tube has an elongated shape in a cross section in a direction substantially perpendicular to a flow direction of the mixed gas.

2. The charged particle beam apparatus according to claim 1,
   wherein the first beam generator is configured to emit the charged particle beam from a direction that intersects a major axis direction of the elongated shape of the opening when viewed in the flow direction of the mixed gas.

3. The charged particle beam apparatus according to claim 1,
   wherein the first beam generator is configured to emit the charged particle beam from a direction that is substantially perpendicular to a major axis direction of the elongated shape of the opening when viewed in the flow direction of the mixed gas.

4. The charged particle beam apparatus according to claim 1,
   wherein the first beam generator is configured to emit the charged particle beam from a direction that is inclined with respect to a major axis direction and a minor axis direction of the elongated shape of the opening when viewed in the flow direction of the mixed gas.

5. The charged particle beam apparatus according to claim 1,
   wherein the first beam generator is configured to
   emit the charged particle beam to the mixed gas to ionize at least two of the plurality of types of gases as a mixed ion beam, and
   emit the mixed ion beam to the sample.

6. The charged particle beam apparatus according to claim 5,
   wherein, in a cross section in a direction substantially perpendicular to the flow direction of the mixed ion beam, a width of the mixed ion beam in a major axis direction of the elongated shape of the opening is equal to a width of the charged particle beam.

7. The charged particle beam apparatus according to claim 5,
   wherein, in a cross section in a direction substantially perpendicular to a flow direction of the mixed ion beam, a thickness of the mixed ion beam in a direction substantially perpendicular to a major axis direction of the elongated shape of the opening is equal to a minor diameter of the elongated shape of the opening.

8. The charged particle beam apparatus according to claim 5,
   wherein the first beam generator is configured to emit a plurality of the charged particle beams to the mixed gas, and simultaneously emit a plurality of the mixed ion beams to the sample.

9. The charged particle beam apparatus according to claim 5,
   wherein the first beam generator is configured to move the mixed ion beam by changing a position of the charged particle beam with respect to the mixed gas.

10. The charged particle beam apparatus according to claim 5, further comprising:
    a second beam generator configured to emit a second ion beam having an atomic weight larger than an atomic weight of the mixed ion beam to the sample.

11. A method using a charged particle beam apparatus which comprises
    a chamber configured to accommodate a sample with, an inside of the chamber being decompressed,
    a tube having an opening disposed in the chamber,
    a first beam generator, and
    a mixed gas generator,
    the method comprising:
    providing, by the mixed gas generator, a mixed gas having a plurality of types of gases to the tube;
    introducing, via the tube, the mixed gas in a direction towards the sample, substantially perpendicular to a direction of an elongated shape of an opening of the tube in a cross section; and
    emitting, by the first beam generator, a charged particle beam toward at least one of a region between the opening of the tube and the sample, or a region of the sample against which the mixed gas collides.

12. The method according to claim 11, further comprising:
    emitting, by the first beam generator, the charged particle beam from a direction that intersects a major axis direction of the elongated shape of the opening when viewed in the flow direction of the mixed gas.

13. The method according to claim 11, further comprising:
emitting, by the first beam generator, the charged particle beam from a direction substantially perpendicular to a major axis direction of the elongated shape of the opening when viewed in the flow direction of the mixed gas.

14. The method according to claim 11, further comprising:
emitting, by the first beam generator, the charged particle beam from a direction that is inclined with respect to a major axis direction and a minor axis direction of the elongated shape of the opening when viewed in the flow direction of the mixed gas.

15. The method according to claim 11, further comprising:
emitting, by the first beam generator, the charged particle beam to the mixed gas to ionize at least two of the plurality of types of gases as a mixed ion beam; and
emitting, by the first beam generator, the mixed ion beam to the sample.

16. The method according to claim 15,
wherein, in a cross section in a direction substantially perpendicular to the flow direction of the mixed ion beam, a width of the mixed ion beam in a major axis direction of the elongated shape of the opening is equal to a width of the charged particle beam.

17. The method according to claim 15,
wherein, in a cross section in a direction substantially perpendicular to a flow direction of the mixed ion beam, a thickness of the mixed ion beam in a direction substantially perpendicular to a major axis direction of the elongated shape of the opening is equal to a minor diameter of the elongated shape of the opening.

18. The method according to claim 15, further comprising:
emitting, by the first beam generator, a plurality of the charged particle beams to the mixed gas, and simultaneously emitting a plurality of the mixed ion beams to the sample.

19. The method according to claim 15, further comprising:
moving, by the first beam generator, the mixed ion beam by changing a position of the charged particle beam with respect to the mixed gas.

20. The method according to claim 15, further comprising:
emitting, by a second beam generator of the charged particle beam apparatus, a second ion beam having an atomic weight larger than an atomic weight of the mixed ion beam to the sample.

* * * * *